(12) United States Patent
He et al.

(10) Patent No.: US 8,658,336 B2
(45) Date of Patent: Feb. 25, 2014

(54) METHODS OF CORRECTING FOR VARIATION ACROSS SUBSTRATES DURING PHOTOLITHOGRAPHY

(75) Inventors: Yuan He, Boise, ID (US); Scott L. Light, Boise, ID (US); Tim H. Bossart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 13/460,765

(22) Filed: Apr. 30, 2012

(65) Prior Publication Data

US 2013/0288167 A1 Oct. 31, 2013

(51) Int. Cl.
*G03C 5/00* (2006.01)
(52) U.S. Cl.
USPC .................................. 430/30; 355/53; 355/77
(58) Field of Classification Search
USPC ........................................ 430/30; 355/53, 77
See application file for complete search history.

(56) References Cited

U.S. PATENT DOCUMENTS

| 7,006,195 | B2 | 2/2006 | Raebiger et al. |
| 2002/0073394 | A1 | 6/2002 | Milor et al. |
| 2004/0156029 | A1 | 8/2004 | Hansen |
| 2005/0075819 | A1 | 4/2005 | Paxton et al. |
| 2006/0141376 | A1 | 6/2006 | Levy et al. |

OTHER PUBLICATIONS

Mangan et al., "Novel Lithography Approach Using Feed-Forward Mask-Based Wafer CDU Correction Increases Fab Productivity and Yield". Research paper. 12 pp.
Pforr et al., "Performance comparison of techniques for intra-field CD control improvement". Research paper. 9 pp.

*Primary Examiner* — Christopher Young
(74) *Attorney, Agent, or Firm* — Wells St. John P.S.

(57) ABSTRACT

Some embodiments include methods for correcting for variation across substrates. A difference map is created to indicate differences between a desired pattern that is to be formed across the substrates utilizing photolithographic processing and a signature pattern representing the actual pattern formed with an initial setting of illumination optics. Modifications to the illumination optics are determined for improving problematic regions identified in the difference map, and the illumination optics are then modified. Substrates are photolithographically processed utilizing the modified illumination optics.

21 Claims, 5 Drawing Sheets

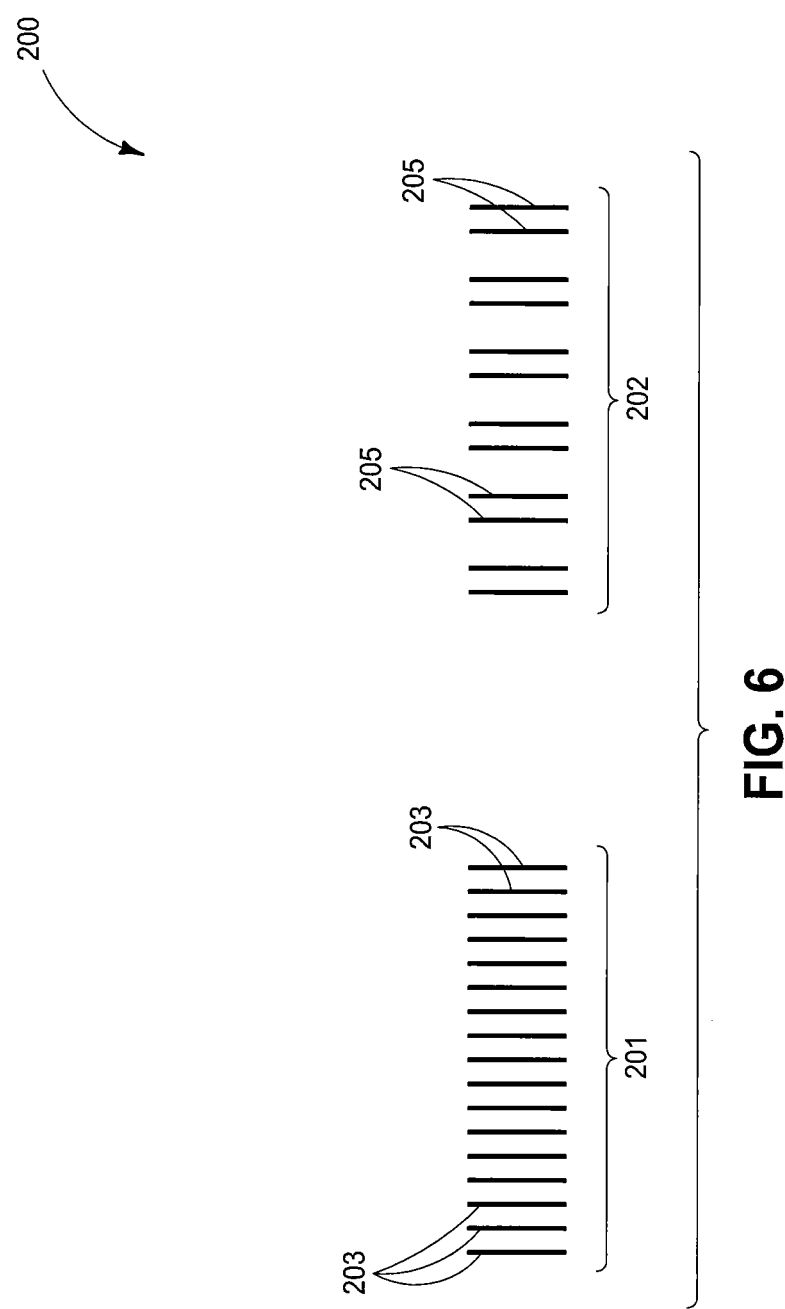

METHODS OF CORRECTING FOR VARIATION ACROSS SUBSTRATES DURING PHOTOLITHOGRAPHY

TECHNICAL FIELD

Methods of correcting for variation across substrates during photolithography.

BACKGROUND

Photolithographic processing may be utilized to create a mask that is ultimately used for patterning a semiconductor substrate. Photolithographic processing comprises forming a patterned image of light across a photosensitive material (for instance, photoresist). The light alters exposed regions relative to unexposed regions. Subsequent development of the photosensitive material selectively removes the exposed regions relative to the unexposed regions, or vice versa, to thereby convert the photosensitive material into a patterned mask.

FIG. 1 shows an example prior art wafer 10, and shows a grid 12 across the wafer. The grid represents individual dice that will ultimately be cut from the wafer. Some of the dice are partial dice, and may or may not be utilized. The remaining dice are whole dice, and it may be desired that the whole dice be fabricated identically to one another. Thus, it may be desired to form an identical pattern on each whole die. The patterns may be intricate, and in some applications may comprise a substantial number of repeating units. For instance, the patterns may correspond to memory array patterns, such as patterns corresponding to dynamic random access memory (DRAM) components, Flash memory components (e.g., NAND components), etc.

The wafer 10 comprises a photosensitive material thereon (not shown). Photolithographic processing of the wafer comprises exposure of such photosensitive material to an image corresponding to a positive or negative representation of the desired repeating intricate pattern that is to be formed across the wafer. The image may be created from a single photomask that covers the entire wafer so that one exposure creates an entirety of the image. Alternatively, the image may be created with multiple exposures using a reticle that defines a repeating portion of the image, with such reticle being stepped across the wafer to ultimately create an entirety of the desired image across the wafer.

Regardless of how the image is created across the wafer, there may be undesired variation in the patterns formed across the topography of the wafer. Specifically, dice fabricated in some regions of the wafer may differ from dice fabricated in other regions of the wafer. Such differences may lead to non-uniformity within a production lot of dice. If some of the components formed within the dice are outside of appropriate tolerances, the non-uniformity may lead to unusable parts and associated waste.

FIG. 2 diagrammatically illustrates a pair of regions 14 and 16 that may have variation relative to one another. The region 14 is centrally located on wafer 10, and the region 16 is along the edge of the wafer. Processing utilized to form integrated circuitry across the wafer, and/or to form a photosensitive material on the wafer, may lead to thickness variation across the wafer so that regions 14 and 16 are differently spaced from the optics utilized to form an image during photolithographic processing. Such spacing difference may lead to variation in a pattern formed at region 14 relative to that formed at region 16. Additionally, or alternatively, the fact that region 16 is closer to the edge than region 14 may lead to variation in a pattern formed in region 16 relative to region 14 due to variation in the mechanics or optics utilized to form an image during photolithographic processing. Additionally, or alternatively, undesired variation may be introduced at a processing stage after exposure of the photosensitive material to light.

Regardless of the reason for the variability in the pattern formed across wafer 10, such variability is found to occur, and is problematic. Accordingly, it would be desired to develop methods for addressing such variability.

BRIEF DESCRIPTION OF THE DRAWINGS

FIG. 6 is a diagrammatic representation of an example pattern that may be formed across a semiconductor wafer during a photolithographic process.

DETAILED DESCRIPTION OF THE ILLUSTRATED EMBODIMENTS

Some embodiments include methods for reducing variability across substrates during photolithographic processing.

Figure 1:
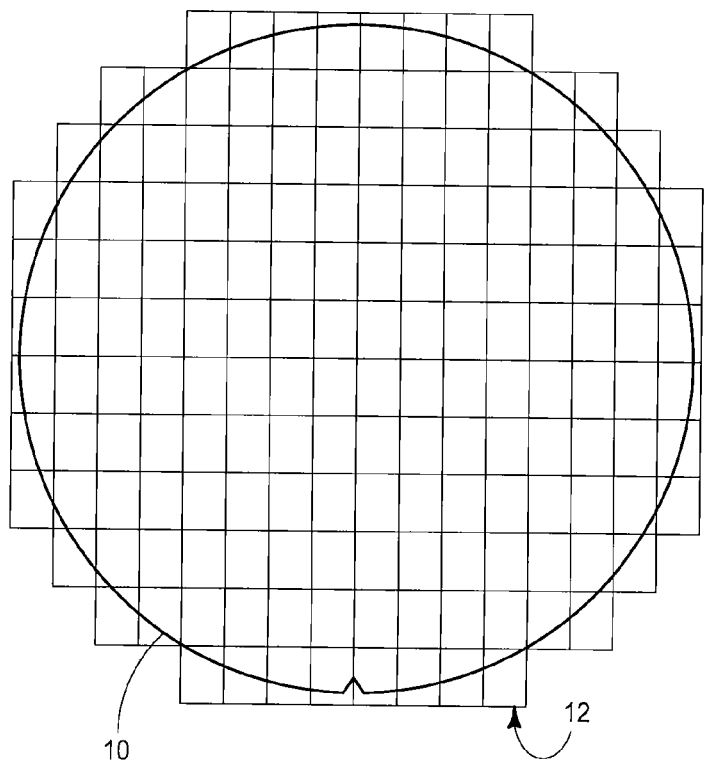
FIG. 1 is a diagrammatic view of a semiconductor wafer illustrating an example pattern of dice formed across the wafer with prior art processing.
Figure 2:
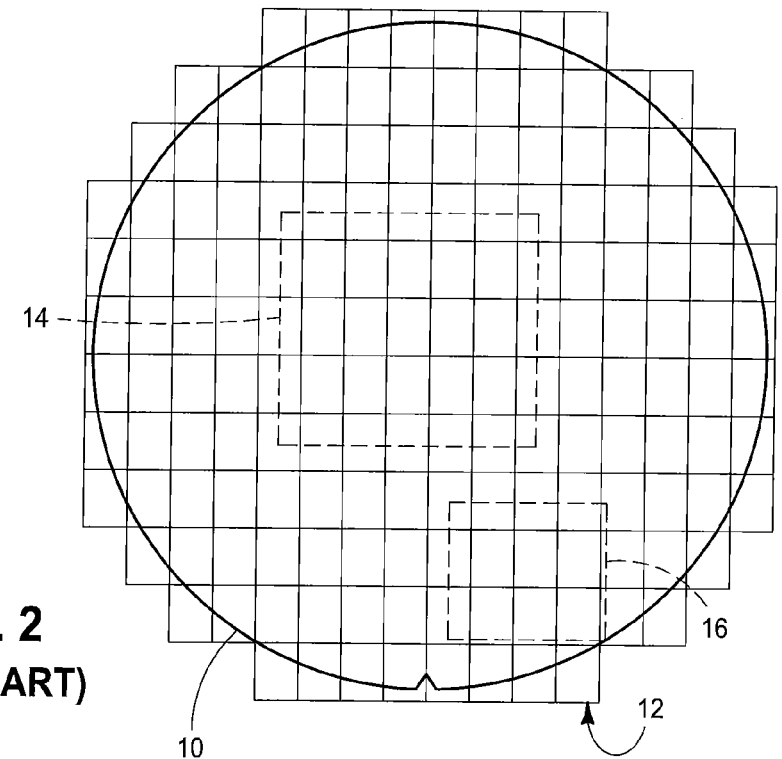
FIG. 2 is a diagrammatic view of the wafer of FIG. 1 showing regions which may have variation relative to one another during prior art processing.
Figure 3:
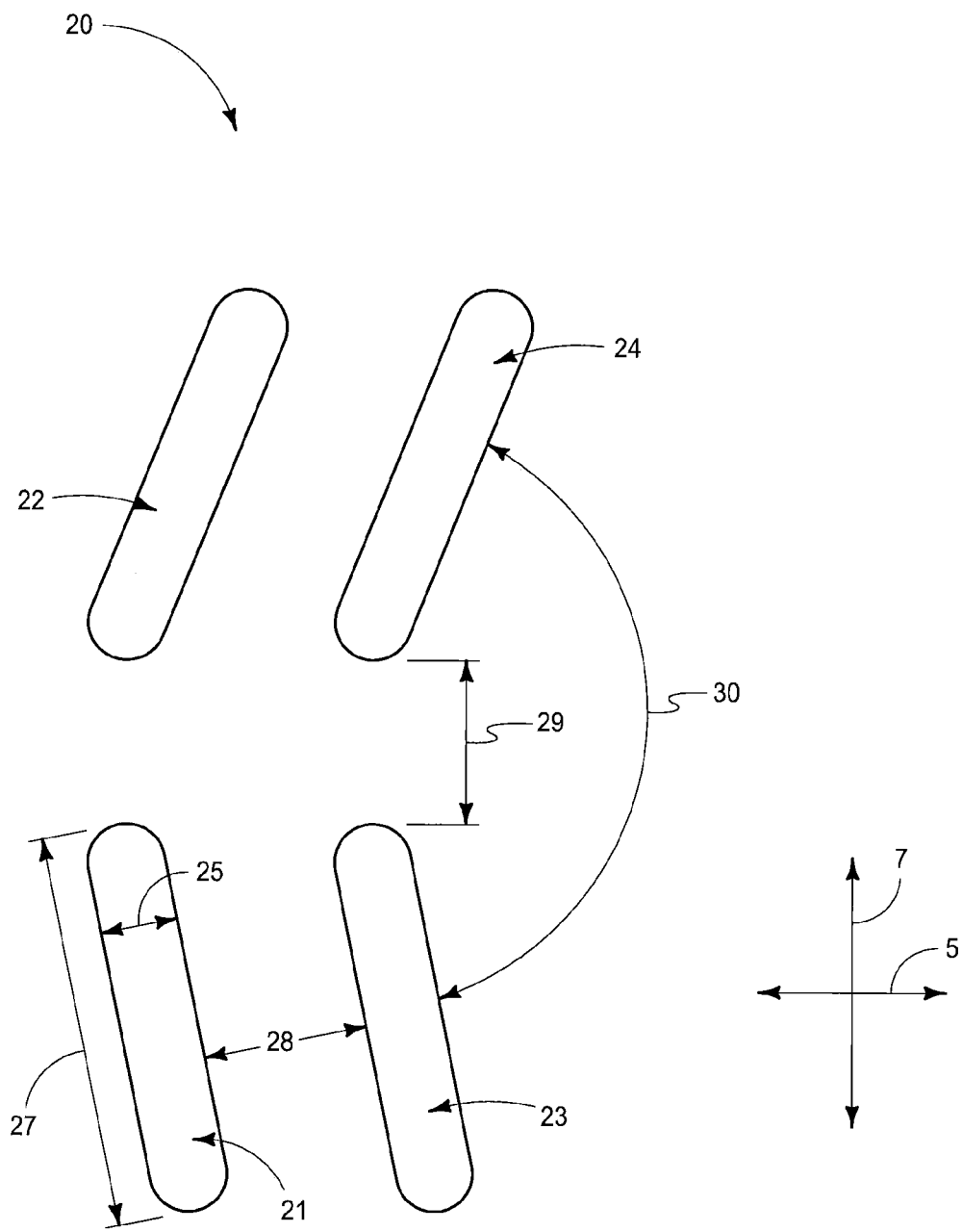
FIG. 3 is a diagrammatic representation of a portion of an example embodiment repeating pattern of an image that may be formed across a semiconductor wafer during a photolithographic process.

FIG. 3 diagrammatically represents a portion of a repeating pattern 20 that may be formed with a photolithographic process. The illustrated pattern may, for example, represent an image formed in photosensitive material during the photographic process. As another example, the illustrated pattern may represent a mask created from the photosensitive material by development of such material after imparting the image to the material. As another example, the pattern may be within a material that was etched utilizing the photosensitive material mask as a template. Regardless, the pattern 20 reflects a pattern formed utilizing a photographic process.

The pattern 20 comprises four features 21-24. The pattern comprises numerous spacings and angles that are desired to be uniform (i.e., within tolerances) across repeating units of the pattern. For instance, the individual features have widths, as indicated by the labeled width 25 of feature 21. The individual features also have lengths, as indicated by the labeled length 27 of feature 21. Further, the features are laterally spaced from one another by a defined distance, as indicated by the labeled distance 28 between features 21 and 23; and are longitudinally spaced from one another by another defined distance, as indicated by the labeled distance 29 between features 23 and 24. Additionally, the features have angles relative to one another, as indicated by the labeled angle 30 between features 23 and 24.

All of the distances and angles between and amongst the various features have defined tolerances, and any of these dimensions may undesirably vary within the repeating pattern formed across a semiconductor wafer. Some prior art methods have attempted to address the variability by adjusting the dose of electromagnetic radiation imparted to photosensitive material at various regions across the wafer. However, such methods have proven difficult to utilize for adjusting all of the various dimensions that may vary across the pattern. For instance, the prior art methods may be difficult to utilize for adjusting for variation across two directions that are orthogonal to one another (for instance, the illustrated orthogonal directions 5 and 7). Instead, the prior art methods may be suitable for adjusting relative to one of the orthogonal directions, but frequently are not suitable for adjusting the relative to both orthogonal directions simultaneously.

There have been efforts in the prior art to attempt to remove thickness variation, and/or other variation across the wafer to thereby reduce some of the problems that lead to variation imparted during photolithography. However, such methods may be costly to implement, and may still fail to satisfactorily remove variability imparted during photolithographic processing.

Figure 4:
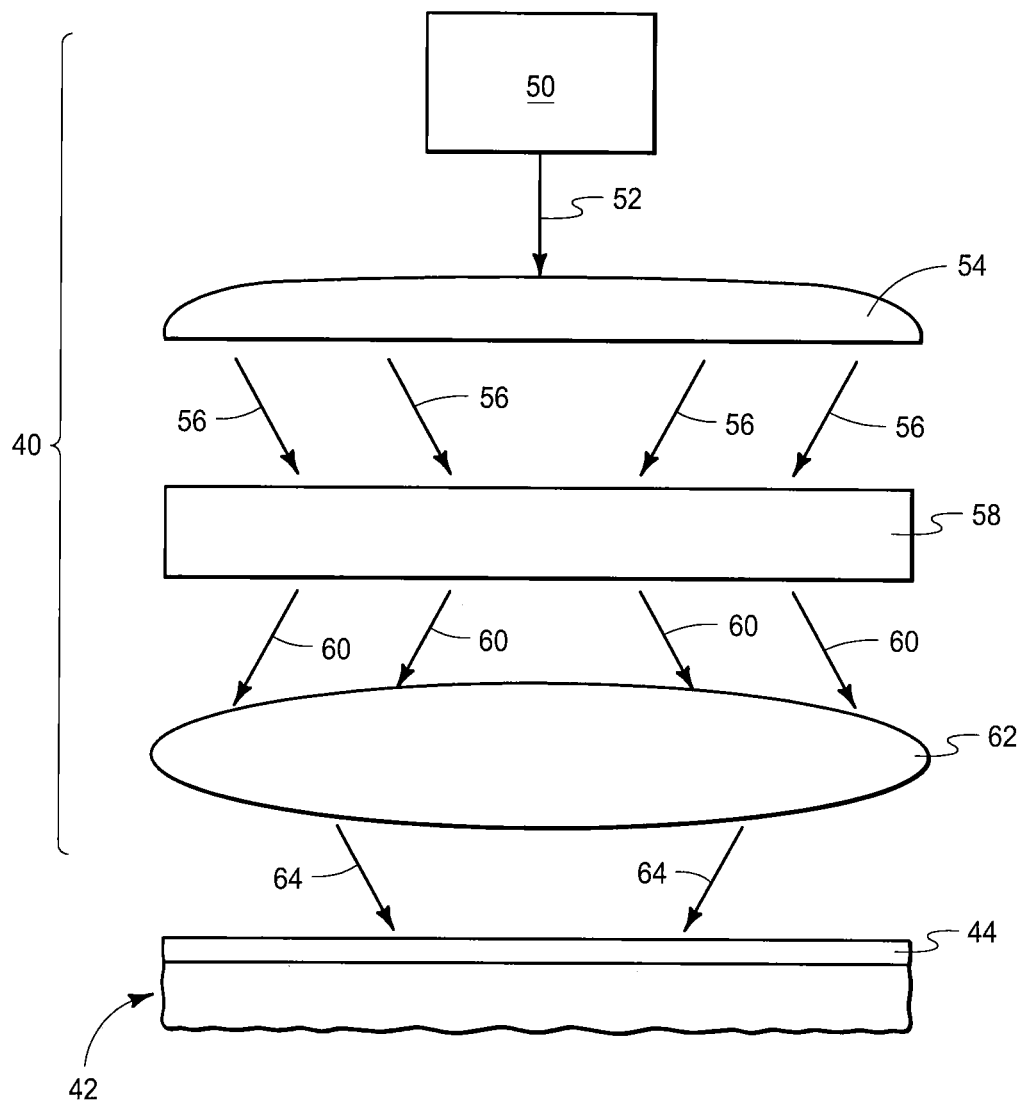
FIG. 4 is a diagrammatic representation of an assembly that may be utilized for imparting an image to a photosensitive material during a photolithographic process.

FIG. 4 shows an example embodiment assembly 40 that may be utilized for imparting an image to a photosensitive material during a photolithographic process. A semiconductor substrate 42 is provided beneath the assembly, and such substrate has a photosensitive material 44 (for instance photoresist) provided thereover.

The semiconductor substrate may comprise a wafer of semiconductor material. For instance, such wafer may comprise monocrystalline silicon. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. The wafer may be homogeneous, or may comprise numerous materials in some embodiments. For instance, the wafer may correspond to a semiconductor substrate containing one or more materials associated with integrated circuit fabrication. In such embodiments, such materials may correspond to one or more of refractory metal materials, barrier materials, diffusion materials, insulator materials, etc.

The apparatus 40 comprises a light source 50 that directs electromagnetic radiation 52 into illumination optics 54 configured to shape the radiation. The illumination optics may comprise any suitable structure(s) configured for imparting a desired shape to the radiation, including, for example, at least one of a diffractive optical element (such as a grating), a prism, a mirror arrangement, etc.

Electromagnetic radiation 56 exits the illumination optics in a desired shape for off-axis illumination of a reticle 58. Off-axis illumination may be desired for imparting the intricate patterns utilized in modern semiconductor fabrication.

Electromagnetic radiation 60 exits reticle 58 in a pattern determined by reticle 58. The radiation may be then passed through a lens 62 configured to focus the radiation onto the photosensitive material 44. Focused radiation 64 is shown being directed from lens 62 to the photosensitive material 44.

Some embodiments include recognition that adjustment of the shape created with the illumination optics 54 can enable simultaneous improvement along two orthogonal axes (for instance, the two orthogonal axes 5 and 7 of FIG. 3), and thus can be utilized to improve a photolithographic process.

Figure 5:
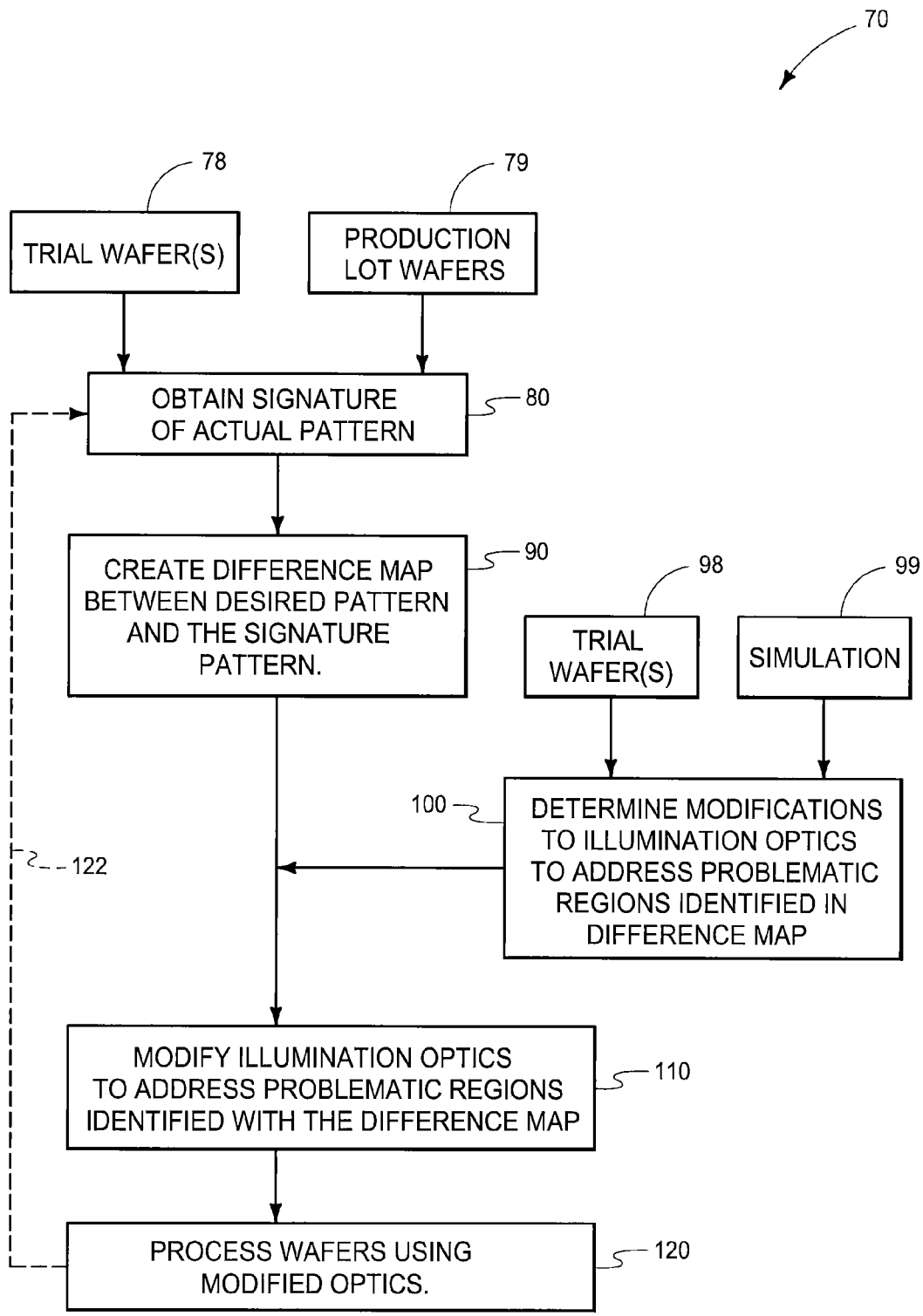
FIG. 5 is a flowchart diagram illustrating example embodiment methods for correcting for variation across substrates during photolithographic processing.

FIG. 5 provides a flowchart 70 illustrating example embodiment processing that may be utilized for correcting for variation across a semiconductor substrate to improve a photolithographic process.

The processing of FIG. 5 includes the obtaining a signature of the actual pattern formed across substrates in a photographic process, as shown in step 80. The photolithography process comprises an initial setting of illumination optics, and the signature pattern will be a map across the substrates representing the actual pattern formed by the photolithographic process utilizing the initial illumination optics settings. The substrates may correspond to semiconductor wafers, and the photolithographic processing may be analogous to that described above with reference to FIG. 4. The signature pattern may be obtained by scanning the photoresist mask formed from the exposure and development of a photosensitive material. Such scanning may be conducted with any suitable methodology, including, for example, utilization of a scanning electron microscope (SEM), utilization of optical scatterometry, etc. In some embodiments, the scanning may be utilized to measure various dimensions at designated sampling locations across an exposure field or wafer in order to obtain the signature pattern. In some embodiments, the signature pattern may be obtained by scanning a pattern that has been formed in a substrate after the photoresist mask has been utilized as a template. Such pattern may be formed in the substrate, for example, by exposing the substrate to one or more etches while the photoresist mask template covers the substrate. Regardless of whether the photoresist mask is utilized for the signature pattern, or the patterned substrate is utilized for the signature pattern, the signature pattern can be a map representing variation across a pattern formed utilizing photolithographic processing.

The signature pattern may be obtained from one or more trial wafers utilized solely for determining such signature pattern (as shown as step 78) and/or may be obtained from one or more wafers of a production lot (as shown as step 79). It may be advantageous to utilize more than one wafer for generating the signature pattern in that the signature pattern may then be an average across multiple wafers to better account for statistical variability that may be present in, for example, the measurement process, the photolithographic process underlying the signature pattern and/or other variations in the substrate and/or processing.

Referring to step 90, a difference map is created to reflect the difference between a desired pattern that is to be formed across the wafers (or other suitable substrates) and the signature pattern. The difference map will catalog, for example, various distances and angles between features to identify problematic regions where variation is occurring relative to the desired pattern. For instance, if the desired pattern is a repeating pattern of a memory array (such as a DRAM array, a NAND memory array, etc.), the problematic regions may correspond to regions where distances and/or angles vary by more than a statistically insignificant amount. In some applications, the difference map may identify regions where the variation is outside of acceptable tolerances.

The difference map may comprise any suitable mathematical representation of differences between the desired pattern and the signature pattern. For instance, the difference map may include differences between distances measured in the desired pattern and the signature pattern. Such distances may be measured along at least two directions that are orthogonal to one another (for instance, the directions represented by the axes 5 and 7 of FIG. 3), and/or may include parallel critical features on different pitches (as described below with reference to FIG. 6). Thus, the difference map may be utilized as part of a process for correcting for variation occurring across multiple orthogonal directions, which may provide advantages relative to prior art methods which may be more limited relative to the corrections that may be applied.

In some embodiments, the difference map may be generated by comparison of multiple vectors from the signature pattern with analogous vectors from the desired pattern. In such embodiments, some of the vectors may be along directions that are orthogonal to the directions of others of the vectors.

Referring to step 100, determination is made of the modifications that will alter the illumination optics to address the problematic regions identified in the difference map. The modifications may include, for example, altering the shape of the light emitted from the illumination optics (such as, for example, the shape of the light 56 shown in FIG. 4). The determination made in step 100 may also include determination of the sensitivity of the photolithographic processing conditions (for instance, the conditions of step 80) to changes in the illumination optics.

The determination of step 100 may be accomplished with any suitable method. For instance, the determination may be accomplished utilizing one or more trial wafers, and a trial and error approach to identify the modifications that ultimately adjust the illumination optics to alleviate or eliminate variations associated with the problematic regions (as shown as step 98). Alternatively, or additionally, the determination may be accomplished utilizing a programmed computer providing a simulation of the effects of various modifications to ultimately ascertain the appropriate modifications suitable for adjusting the illumination optics to alleviate or eliminate the variations associated with the problematic regions (as shown as step 99). In some embodiments, the simulation may be utilized to identify a suitable approximation of the modifications that will alleviate or eliminate the variations associated with the problematic regions; and then the trial wafers may be utilized to either verify the modifications, or to tune such modifications and thereby further refine the modifications.

The modifications to the illumination optics that are identified through steps 90 and 100 may be incorporated into a dataset suitable for altering specific regions of the illumination optics. For instance, if the illumination optics comprise multiple mirrors, the dataset may identify changes to the orientation of one or more of such mirrors.

Referring to step 110, the illumination optics are modified utilizing the modifications developed in steps 90 and 100 to address the problematic regions identified with the difference map, and specifically to alleviate or eliminate variation and/or other problems associated with the problematic regions.

Referring to step 120, wafers are processed utilizing the modified optics to create product having less variation and/or other problems then the product initially produced at step 80. If desired, a feedback loop 122 may be introduced so that some of the processed wafers from step 120 are sent back through the processing of steps 80, 90 and 110 from time-to-time to maintain high-level performance of a wafer-fabrication process. The wafers fabricated at the processing step 120 may comprise any suitable patterns. In some embodiments, the wafers may comprise repeating patterns of memory arrays, such as, for example, DRAM arrays, NAND memory arrays and other FLASH memory, etc.

In some embodiments the processing of FIG. 5 may be utilized to maintain various angles and dimensions (for instance, angles and dimensions analogous to those described above with reference to FIG. 3) within desired tolerances. Additionally, or alternatively, the processing of FIG. 5 may be utilized to maintain parallel features on different pitches within a pattern. For instance, FIG. 6 shows an example pattern 200 that may be formed on a die in an example embodiment. The pattern comprises a first region (or section) 201 with features 203 (only some of which are labeled) on a first pitch, and a second region (or section) 202 with features 205 (only some of which are labeled) on a second pitch different from the first pitch. In some embodiments, processing of FIG. 5 may be utilized to maintain desired tolerances of the features on the first pitch while simultaneously maintaining desired tolerances of the features on the second pitch.

Several synonyms (for instance, adjusting, modifying, changing, altering, etc. (and forms thereof)) may be utilized in describing and claiming various aspects of the invention. The term "modifying" (and forms thereof) may be considered generic to all of such synonyms; and utilization of one synonym over another is not intended to indicate a significant difference, unless such difference is explicitly specified.

Some embodiments include methods of correcting for variation across substrates. A difference map is created to reflect differences between a desired pattern that is to be formed across the substrates utilizing photolithographic processing and a signature pattern, where the signature pattern represents a pattern formed with an initial setting of illumination optics. Modifications to the illumination optics are determined which will improve problematic regions identified in the difference map. The illumination optics are modified with the determined modifications to improve the problematic regions. Substrates are photolithographically processed utilizing the modified optics.

Some embodiments include methods of correcting for variation across semiconductor wafers. A first set of trial wafers is photolithographically processed utilizing an initial setting of illumination optics. The processed wafers are scanned to obtain a signature pattern representing the actual pattern formed with the initial setting of the illumination optics. A difference map is created to reflect differences between a desired pattern that is to be formed across the substrates during photolithographic processing and the signature pattern. The creation of the difference map includes comparison of vectors along at least two directions that are orthogonal to one another. A second set of trial wafers is used to determine modifications to the illumination optics that will improve problematic regions identified in the difference map. The illumination optics are modified with the determined modifications to improve the problematic regions. Wafers are photolithographically processed utilizing the modified optics.

Some embodiments include methods of correcting for variation across semiconductor wafers. A first set of trial wafers is processed utilizing an initial setting of illumination optics. The processing includes stepping a reticle across the substrate and passing light through the reticle to create an image in a photosensitive material on the wafers. The image comprises multiple repeating structures of a memory array. The processed wafers are developed to form patterned masks from the photosensitive material. The patterned masks are scanned to obtain a signature pattern representing the actual pattern formed with the initial setting of the illumination optics. A difference map is created to reflect differences between a desired pattern that is to be formed across the substrates during photolithographic processing and the signature pattern. The difference map includes differences measured along at least two directions that are orthogonal to one another. The difference map indicates problematic regions of the processed wafers where differences outside of desired tolerances are found between the actual pattern and the desired pattern. The illumination optics are modified to improve the problematic regions. Wafers are photolithographically processed utilizing the modified optics to form memory arrays having the repeating structures.

Some embodiments include methods of correcting for variation across semiconductor wafers. A first set of trial wafers is processed utilizing an initial setting of illumination optics. The processing includes stepping a reticle across the substrate and passing light through the reticle to create an image in a photosensitive material on the wafers. The image comprises at least two sections which have different pitches relative to one another. The processed wafers are developed to form patterned masks from the photosensitive material. The patterned masks are scanned to obtain a signature pattern representing the actual pattern formed with the initial setting of the illumination optics. A difference map is created to reflect differences between a desired pattern that is to be formed across the substrates during photolithographic processing and the signature pattern. The difference map includes differences measured along at least two directions that are orthogonal to one another. The difference map indicates problematic regions of the processed wafers where differences outside of desired tolerances are found between the actual pattern and the desired pattern. The illumination optics are modified to improve the problematic regions. Wafers are photolithographically processed utilizing the modified optics to form memory arrays having sections with the different pitches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of correcting for variation across substrates during photolithographic processing, comprising:
   creating a difference map between a desired pattern that is to be formed across the substrates utilizing photolithographic processing and a signature pattern; wherein the signature pattern represents a pattern formed with an initial setting of illumination optics and the difference map is generated by comparison of multiple vectors from the signature pattern with analogous vectors from the desired pattern, some of the vectors being along directions that are orthogonal to directions of other of the vectors;
   determining modifications to the illumination optics that will improve problematic regions identified in the difference map;
   modifying the illumination optics with the determined modifications to improve the problematic regions; and
   photolithographically processing substrates utilizing the modified optics.

2. The method of claim 1 wherein the substrates are semiconductor wafers, and wherein the determining of the modifications to the illumination optics that will improve problematic regions identified in the difference map comprises:
   photolithographically processing one or more trial wafers utilizing trial settings of the illumination optics; and
   scanning the processed wafers to ascertain sensitivity of processing conditions to changes in the illumination optics and/or to ascertain shapes of light exiting the illumination optics that will improve the problematic regions.

3. The method of claim 1 wherein the substrates are semiconductor wafers, and wherein the determining of the modifications to the illumination optics that will improve problematic regions identified in the difference map comprises:
   simulating patterns formed with trial settings of the illumination optics; and
   utilizing the simulations to ascertain sensitivity of processing conditions to changes in the illumination optics and/or to ascertain shapes of light exiting the illumination optics that will improve the problematic regions.

4. The method of claim 1 wherein the substrates are semiconductor wafers, and wherein the creating of the difference map comprises:
   photolithographically processing one or more trial wafers utilizing the initial setting of the illumination optics; and
   scanning the processed wafers to obtain the signature pattern.

5. The method of claim 1 further comprising utilizing one or more of the substrates that have been photolithographically processed with the modified optics in a feedback loop to create another difference map.

6. A method of correcting for variation across semiconductor wafers, comprising:
   photolithographically processing a first set of trial wafers utilizing an initial setting of illumination optics;
   scanning the processed wafers to obtain a signature pattern representing the actual pattern formed with the initial setting of the illumination optics;
   creating a difference map between a desired pattern that is to be formed across the substrates during photolithographic processing and the signature pattern, the creation of the difference map including comparison of vectors along at least two directions which are orthogonal to one another;
   utilizing a second set of trial wafers to determine modifications to the illumination optics that will improve problematic regions identified in the difference map;
   modifying the illumination optics with the determined modifications to improve the problematic regions; and
   photolithographically processing wafers utilizing the modified optics.

7. The method of claim 6 wherein the photolithographic processing patterns one or more components of a memory array.

8. The method of claim 6 wherein the photolithographic processing patterns one or more components of a DRAM array.

9. The method of claim 6 wherein the photolithographic processing patterns one or more components of a NAND array.

10. A method of correcting for variation across semiconductor wafers, comprising:
   processing a first set of trial wafers utilizing an initial setting of illumination optics; the processing comprising stepping a reticle across the substrate and passing light through the reticle to create an image in a photosensitive material on the wafers; the image comprising multiple repeating structures of a memory array;
   developing the processed wafers to form patterned masks from the photosensitive material;
   scanning the patterned masks to obtain a signature pattern representing the actual pattern formed with the initial setting of the illumination optics;
   creating a difference map between a desired pattern that is to be formed across the substrates during photolithographic processing and the signature formed with the initial setting of illumination optics, the difference map including differences measured along at least two directions which are orthogonal to one another; the difference map indicating problematic regions of the processed wafers where differences outside of desired tolerances are found between the actual pattern and the desired pattern;

modifying the illumination optics to improve the problematic regions; and photolithographically processing wafers utilizing the modified optics to form memory arrays having the repeating structures.

11. The method of claim 10 wherein the memory arrays are DRAM arrays.

12. The method of claim 10 wherein the memory arrays are NAND arrays.

13. The method of claim 10 further comprising utilizing one or more of the wafers that have been photolithographically processed with the modified optics in a feedback loop to create another difference map.

14. The method of claim 10 wherein the modifying of the illumination optics comprises:

photolithographically processing one or more trial wafers utilizing trial settings of the illumination optics;

scanning the processed wafers to ascertain sensitivity of processing conditions to changes in the illumination optics and/or to ascertain shapes of light exiting the illumination optics that will improve the problematic regions;

creating a dataset of modifications to the illumination optics utilizing information obtained from the scanning of the processed wafers; and modifying the illumination optics with such dataset.

15. The method of claim 10 wherein the modifying of the illumination optics comprises:

simulating patterns formed with trial settings of the illumination optics;

utilizing the simulations to ascertain sensitivity of processing conditions to changes in the illumination optics and/or to ascertain shapes of light exiting the illumination optics that will improve the problematic regions;

creating a dataset of modifications to the illumination optics utilizing information obtained from the simulations; and modifying the illumination optics with such dataset.

16. A method of correcting for variation across semiconductor wafers, comprising:

processing a first set of trial wafers utilizing an initial setting of illumination optics; the processing comprising stepping a reticle across the substrate and passing light through the reticle to create an image in a photosensitive material on the wafers; the image comprising at least two sections having different pitches relative to one another;

developing the processed wafers to form patterned masks from the photosensitive material;

scanning the patterned masks to obtain a signature pattern representing the actual pattern formed with the initial setting of the illumination optics;

creating a difference map between a desired pattern that is to be formed across the substrates during photolithographic processing and the signature formed with the initial setting of illumination optics, the difference map including differences measured along each of the at least two sections; the difference map indicating problematic regions of the processed wafers where differences outside of desired tolerances are found between the actual pattern and the desired pattern, the difference map being generated by comparison vectors of multiple vectors from the signature pattern with analogous vectors from the desired pattern, some of the vectors being along directions that are orthogonal to directions of other of the vectors;

modifying the illumination optics to improve the problematic regions; and photolithographically processing wafers utilizing the modified optics to form memory arrays having sections with the different pitches.

17. The method of claim 16 wherein the memory arrays are DRAM arrays.

18. The method of claim 16 wherein the memory arrays are NAND arrays.

19. The method of claim 16 further comprising utilizing one or more of the wafers that have been photolithographically processed with the modified optics in a feedback loop to create another difference map.

20. The method of claim 16 wherein the modifying of the illumination optics comprises:

photolithographically processing one or more trial wafers utilizing trial settings of the illumination optics;

scanning the processed wafers to ascertain sensitivity of processing conditions to changes in the illumination optics and/or to ascertain shapes of light exiting the illumination optics that will improve the problematic regions;

creating a dataset of modifications to the illumination optics utilizing information obtained from the scanning of the processed wafers; and modifying the illumination optics with such dataset.

21. The method of claim 16 wherein the modifying of the illumination optics comprises:

simulating patterns formed with trial settings of the illumination optics;

utilizing the simulations to ascertain sensitivity of processing conditions to changes in the illumination optics and/or to ascertain shapes of light exiting the illumination optics that will improve the problematic regions;

creating a dataset of modifications to the illumination optics utilizing information obtained from the simulations; and modifying the illumination optics with such dataset.

* * * * *

UNITED STATES PATENT AND TRADEMARK OFFICE
CERTIFICATE OF CORRECTION

| | | |
|---|---|---|
| PATENT NO. | : 8,658,336 B2 | Page 1 of 1 |
| APPLICATION NO. | : 13/460765 | |
| DATED | : February 25, 2014 | |
| INVENTOR(S) | : Yuan He et al. | |

It is certified that error appears in the above-identified patent and that said Letters Patent is hereby corrected as shown below:

In the Claims:

In column 10, line 13, in Claim 16, after "comparison" delete "vectors".

Signed and Sealed this
Twenty-ninth Day of July, 2014

Michelle K. Lee
*Deputy Director of the United States Patent and Trademark Office*